(12) United States Patent
Nara

(10) Patent No.: US 8,456,617 B2
(45) Date of Patent: Jun. 4, 2013

(54) EXPOSURE METHOD, EXPOSURE DEVICE, AND MICRO DEVICE MANUFACTURING METHOD

(75) Inventor: Kei Nara, Yokohama (JP)

(73) Assignee: Nikon Corporation, Tokyo (JP)

( * ) Notice: Subject to any disclaimer, the term of this patent is extended or adjusted under 35 U.S.C. 154(b) by 657 days.

(21) Appl. No.: 12/507,275

(22) Filed: Jul. 22, 2009

(65) Prior Publication Data

US 2009/0280441 A1 Nov. 12, 2009

Related U.S. Application Data

(63) Continuation of application No. PCT/JP2008/050943, filed on Jan. 24, 2008.

(30) Foreign Application Priority Data

Jan. 25, 2007 (JP) ................................. 2007-015391

(51) Int. Cl.
G03B 27/32 (2006.01)
G03B 27/42 (2006.01)
G03B 27/54 (2006.01)
G03B 27/74 (2006.01)

(52) U.S. Cl.
USPC ................... 355/68; 355/53; 355/67; 355/77; 372/25

(58) Field of Classification Search
USPC ........ 250/492.2; 355/53, 67–70, 77; 359/855; 372/10–17, 25, 29.01–29.011, 57; 430/67, 430/322, 326
See application file for complete search history.

(56) References Cited

U.S. PATENT DOCUMENTS

| 5,880,817 A * | 3/1999 | Hashimoto ..................... 355/53 |
| 6,285,488 B1 | 9/2001 | Sandstrom |
| 6,351,305 B1 | 2/2002 | Tanaka et al. |
| 6,480,262 B1 | 11/2002 | Tanaka et al. |
| 6,509,954 B1 | 1/2003 | Tanaka et al. |
| 6,556,278 B1 | 4/2003 | Tanaka et al. |

(Continued)

FOREIGN PATENT DOCUMENTS

| EP | 1 722 273 A2 | 11/2006 |
| JP | 07-057986 | 3/1995 |

(Continued)

OTHER PUBLICATIONS

Hornbeck, Larry J., "Digital Light Processing™ for High-Brightness, High-Resolution Applications," *Electronic Imaging 1997—Projection Displays III*, Feb. 1997.

(Continued)

*Primary Examiner* — Hung Henry Nguyen
*Assistant Examiner* — Colin Kreutzer
(74) *Attorney, Agent, or Firm* — Miles & Stockbridge P.C.

(57) ABSTRACT

An exposure device includes: a light source (LS) which emits a pulse light; and a variable shaped mask (8) which has a plurality of aligned micro movable mirrors and forms an arbitrary pattern by selectively changing the operation state of the movable mirrors. A substrate (P) is exposed to the light emitted from the light source and passes through the variable shaped mask. The exposure device further includes a control device (100) which controls the operation timing to change the operation state of the movable mirrors and the pulse application timing of the pulse light emitted from the light source so that they are synchronized.

18 Claims, 15 Drawing Sheets

U.S. PATENT DOCUMENTS

| | | | |
|---|---|---|---|
| 6,753,528 B1 * | 6/2004 | Nikoonahad et al. | 250/341.1 |
| 6,795,169 B2 | 9/2004 | Tanaka et al. | |
| 6,903,798 B2 | 6/2005 | Shirota et al. | |
| 7,023,527 B2 | 4/2006 | Tanaka et al. | |
| 7,088,425 B2 | 8/2006 | Tanaka et al. | |
| 7,372,543 B2 | 5/2008 | Tanaka et al. | |
| 7,372,544 B2 | 5/2008 | Tanaka et al. | |
| 2003/0214644 A1 | 11/2003 | Shirota et al. | |
| 2003/0218753 A1 * | 11/2003 | Reuter | 356/445 |
| 2005/0002002 A1 | 1/2005 | Shirota et al. | |
| 2006/0103827 A1 * | 5/2006 | Derksen | 355/67 |
| 2006/0227069 A1 | 10/2006 | Baselmans et al. | |
| 2006/0243922 A1 * | 11/2006 | Aloni et al. | 250/492.22 |
| 2006/0290914 A1 * | 12/2006 | Van Der Pasch et al. | 355/67 |
| 2008/0079930 A1 * | 4/2008 | Klarenbeek | 356/121 |
| 2010/0039629 A1 * | 2/2010 | Xalter et al. | 355/67 |
| 2010/0108913 A1 * | 5/2010 | Ershov et al. | 250/492.1 |

FOREIGN PATENT DOCUMENTS

| | | |
|---|---|---|
| JP | 2003-332221 | 11/2003 |
| JP | 2004-245905 A | 9/2004 |
| JP | 2006-080539 | 3/2006 |
| JP | 2006-295175 | 10/2006 |
| JP | 2006-319140 | 11/2006 |
| JP | 2009217189 A * | 9/2009 |
| WO | 99/45439 | 9/2009 |

OTHER PUBLICATIONS

Office Action issued Jan. 31, 2012, in Japanese Patent Application No. 2007-015391.

* cited by examiner

EXPOSURE METHOD, EXPOSURE DEVICE, AND MICRO DEVICE MANUFACTURING METHOD

CROSS-REFERENCE TO RELATED APPLICATIONS

This non-provisional application is a continuation application of and claims the benefit of International Application No. PCT/JP2008/050943, filed on Jan. 24, 2008, the entire contents of which are incorporated herein by reference.

TECHNICAL FIELD

The present invention relates to an exposure method, which is for manufacturing a micro device such as a liquid crystal display device through a lithography process, an exposure apparatus, and a micro device manufacturing method using the same.

BACKGROUND ART

When manufacturing a liquid crystal display device, which is one type of a micro device, an exposure apparatus is used to project and expose a pattern of a mask (reticle, photomask, etc.) onto a plate (glass plate, semiconductor wafer, etc.), to which a photoresist is applied, with a projection optical system.

In the prior art, a step-and-repeat type projection exposure apparatus (stepper) is often used to perform batch exposure to transfer the pattern of a mask onto each shot region of a plate. Recently, a step-and-scan type projection exposure apparatus that has been proposed includes a plurality of small projection optical units arranged in plural columns at predetermined intervals in the scanning direction. The exposure apparatus continuously exposure-transfers the pattern of each mask onto each projection optical unit while synchronously scanning the mask stage and the plate stage (see e.g., Japanese Laid-Open Patent Publication No. 7-57986).

The enlargement of liquid crystal display devices has resulted in the enlargement of plates. Presently, plates (glass substrates) having a size of one meter square or more are being used. At the same time, masks have also become larger. As long as the exposure apparatus is required to have a constant pattern rule for devices, a large mask must have a thickness that is much greater than that of a small mask in order to suppress deflection and undulation of the large mask to an extent that is about the same as a small mask. A mask typically used for a TFT (Thin Film Transistor) is formed from costly quartz glass. Thus, a larger mask increases the manufacturing cost. This also increase costs such as the cost for maintaining the flatness of the mask and the cost resulting from longer inspection times for mask patterns.

A mask-less exposure apparatus, which exposure-transfers a pattern onto a substrate using a DMD (Digital Micromirror Device or Deformable Micromirror Device) in lieu of a mask, has been proposed. A DMD includes a plurality of micro movable mirrors (micromirrors) arranged in a two-dimensional array, with each micromirror a mirror surface being inclinable by ±12 degrees about a torsion axis. An electrode is arranged at the lower part of the mirror surface and driven to produce the two states of ON (+12 degrees) and OFF (−12 degrees). When the mirror is ON, light from a light source is reflected toward a projection optical system. When the mirror is OFF, the light is reflected into an absorbing body so that light is not projected outside. The mirrors are individually driven to function as a variable shaped mask that forms any pattern.

The states of a movable mirror may be divided into an operation time (the time during which the mirror changes its inclination+settling time) and a stable time (the time during which the position of the mirror is determined and stabilized). The operation time is an unstable state in which the mirror is changing its inclination or vibrating, and the position of the reflected light is thereby not stable. Thus, the reflected light, of which beam position is stable, can only be used during the stable time. That is, the reflected light does not contribute to exposure during the operation time. This lowers the illuminance in a scan type direct drawing exposure apparatus. When using a light source that emits a continuous light, the emission during the operation time is wasted. In order to ensure the energy required for drawing, a large output laser must be used or the scanning speed must be lowered to extend the stable time. However, this would increase costs and lower the throughput.

DISCLOSURE OF THE INVENTION

It is an object of the present invention to use the energy of light emitted from a light source with high efficiency so that the lowering of illuminance, the output increase of a light source, and the decreasing of the processing speed are suppressed to reduce costs and improve the production efficiency.

A first aspect of the present invention provides an exposure method for exposing a substrate with light emitted from a light source and traveling through a variable shaped mask for forming an arbitrary pattern. The exposure method performs emission of the light emitted from the light source in synchronization with an operation state of the variable shaped mask.

A second aspect of the present invention provides an exposure apparatus including a light source, which emits light, and a variable shaped mask, which forms an arbitrary pattern by selectively changing an operation state of the variable shaped mask. The exposure apparatus exposes a substrate with the light emitted from the light source and traveling through the variable shaped mask. The exposure apparatus includes a controller which controls the emission of the light emitted from the light source in synchronization with an operation state of the variable shaped mask.

With the exposure method of the first aspect and the exposure apparatus of the second aspect of the present invention, the light emitted from the light source is emitted in synchronization with the operation state of the variable shaped mask. Thus, light is emitted after the movable mirror shifts from an operation time to a stable time that contributes to exposure. Further, light is not emitted during the operation time. Thus, the energy of the light emitted from the light source may be utilized with high efficiency. In particular, a Q-switch laser is used as the laser source. A switch is turned OFF during the operation time of the movable mirror to accumulate energy in the laser, and the switch is turned ON during the stable time of the movable mirror. This allows for the emission of a pulse having a large power and is highly efficient.

A third aspect of the present invention provides a micro device manufacturing method including exposing a pattern onto a substrate with the exposure apparatus according to the first aspect of the present invention or the exposure method according to the second aspect of the present invention, and developing the substrate onto which the pattern has been exposed.

With the micro device manufacturing method of the third aspect of the present invention, the energy utilization efficiency of the light source is high. Thus, micro devices may be manufactured at a low cost and satisfactory productivity.

The present invention allows for the energy of the light emitted from the light source to be utilized with high efficiency. This prevents the illuminance from decreasing, the output of the light source from increasing, and the processing speed from decreasing. Further, costs may be reduced, and the production efficiency may be improved.

BEST MODE FOR CARRYING OUT THE INVENTION

Figure 1:
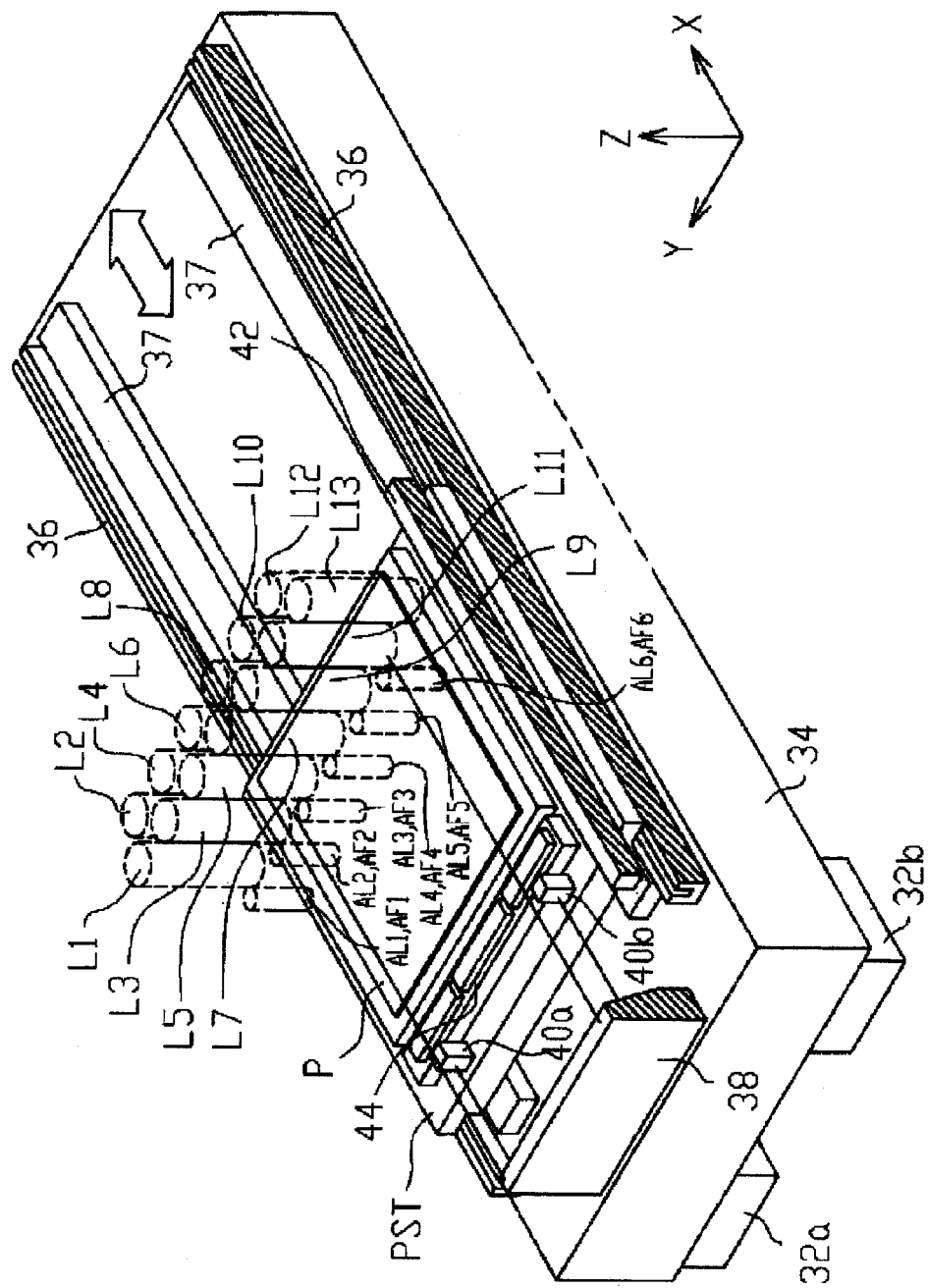
FIG. 1 is a schematic perspective view showing the structure of an embodiment of a scanning exposure apparatus according to the present invention.

An embodiment of a scanning exposure apparatus according to the present invention will now be discussed with reference to the drawings. FIG. 1 is a schematic perspective view showing the structure of the scanning exposure apparatus of this embodiment. In this embodiment, a step-and-scan type scanning projection exposure apparatus for transferring the pattern of a liquid crystal display device and the like onto a plate P, which serves as a substrate, to which a photosensitive material (photoresist) is applied while moving the plate P relative to a plurality of exposure optical units L1 to L13 will be described by way of example.

In the following description, an orthogonal coordinate system is set as shown in FIG. 1, and the positional relationship of each member will be described with reference to the XYZ orthogonal coordinate system. In the XYZ orthogonal coordinate system, the X axis and the Y axis are set to be parallel to the plate P, and the Z axis is set in a direction orthogonal to the plate P. The XYZ orthogonal coordinate system of the drawing is set so that the XY plane is actually set to be parallel to the horizontal plane, and the Z axis is set in the vertical direction. In the present embodiment, the direction (scanning direction) in which the plate P is moved is set as the X direction.

The scanning exposure apparatus includes an exposure optical system for exposure-transferring any pattern onto the plate P. The exposure optical system includes the plurality of exposure optical units L1 to L13. Each of the plurality of exposure optical units L1 to L13 are accommodated in a housing and mounted on a column 1. Each housing includes a cooling device (not shown) for cooling a optical member, which is accommodated in the housing. The exposure optical units L1, L3, L5, L7, L9, L11, and L13 are aligned in the Y direction (non-scanning direction) and arranged rearward (−X direction side) in the scanning direction. The exposure optical units L2, L4, L6, L8, L10, and L12 are aligned in the Y direction and arranged frontward (+X direction side) in the scanning direction. Here, the exposure optical system includes thirteen exposure optical units L1 to L13. However, this may be changed to any other number in accordance with the size of the plate.

Figure 2:
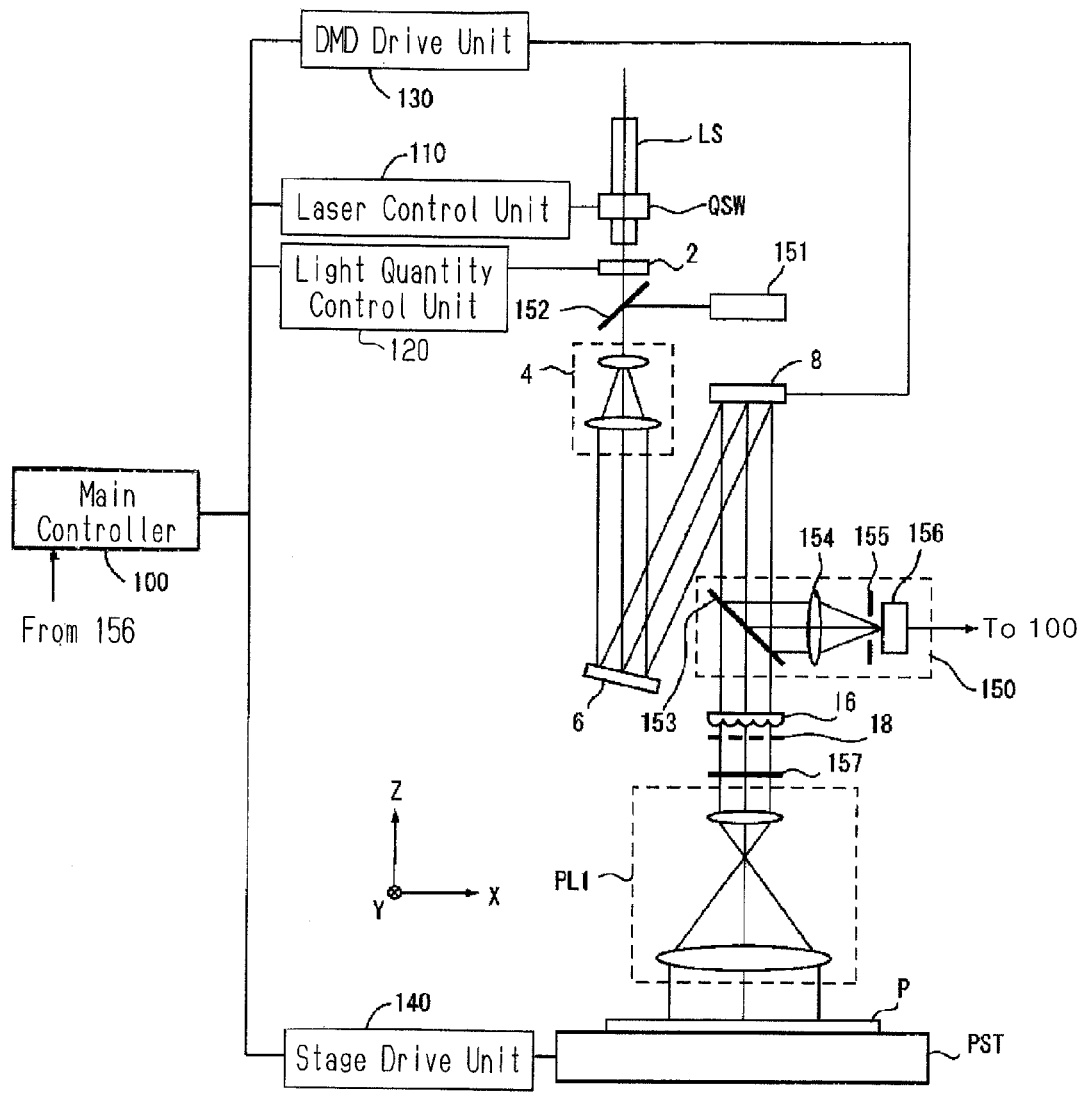
FIG. 2 is a diagram showing the structure of an exposure optical unit according to the embodiment of the present invention.

FIG. 2 is a schematic diagram showing the structure of the exposure optical unit L1. The exposure optical unit L1 includes a light source LS. A Q-switch laser which applies a Q-switch method to a solid laser is used in this embodiment as the light source LS. The Q-switch is a laser technique used to obtain a giant pulse (laser light of high energy). Generally, a normal solid laser is constantly oscillating and thus cannot obtain strong pulses. The Q-switch method first lowers the Q-value (quality factor) until many atoms are excited to suppress oscillation. Then, when the amount of excited atoms becomes sufficient, the Q-value is increased to perform oscillation again (e.g., when the inverted distribution becomes maximum). A specific method for realizing a Q-switch includes any one of a mechanical method, which arranges a rotary prism or an absorbing body between a laser medium and an output mirror or which changes the position of the output mirror, an electro-optical method, which controls the applied voltage by using a crystal (e.g., Pockel's crystal) with a refractive index that varies when voltage is applied, and an acoustic engineering method, which varies the transmissivity with an ultrasonic wave.

The solid laser that forms the light source LS is not particularly limited, but a YAG laser (laser emission wavelength of 1.06 μm) is used in this embodiment. In an exposure apparatus which is for manufacturing liquid crystal display devices, semiconductor devices and the like, shorter wavelengths are being used as circuits become further miniaturized. As the exposure light, i-line (wavelength of 365 nm), KrF excimer laser (wavelength of 248 nm), ArF excimer laser (wavelength of 193 nm), and F2 laser (157 nm) are being used. When the sensitivity of a photosensitive material and resolution of a formed pattern are taken into consideration, the laser emission wavelength of a solid laser such as the YAG laser is too long. Thus, a harmonic frequency is used, which is obtained by converting the wavelength of infrared light emitted from the solid laser with a nonlinear optical crystal and the like to the desired ultraviolet light. The light source LS of the present embodiment therefore includes such a wavelength conversion device. In this embodiment, the frequency of the pulse light output from the light source LS is set to about 10 kHz, and the pulse width of the pulse light is set to about several tens of nanoseconds. The frequency and pulse width are variable to a certain extent by controlling the Q-switch QSW. The Q-switch QSW is controlled by a laser control unit 110 under the control of a main controller 100, which entirely controls the exposure apparatus.

The pulse laser light (hereinafter also referred to as light beam) emitted from the light source LS uniformly illuminates a DMD (Digital Micromirror Device or Deformable Micromirror Device) 8, which forms the exposure optical unit L1, via an attenuator (variable beam attenuator) 2, a collimator optical system 4, and a mirror 6. The DMD 8 may be discrete from the exposure optical unit L1. The light quantity adjustment of emitted light by the attenuator 2 is performed by a light quantity control unit 120 under the control of the main controller 100.

Figure 3:
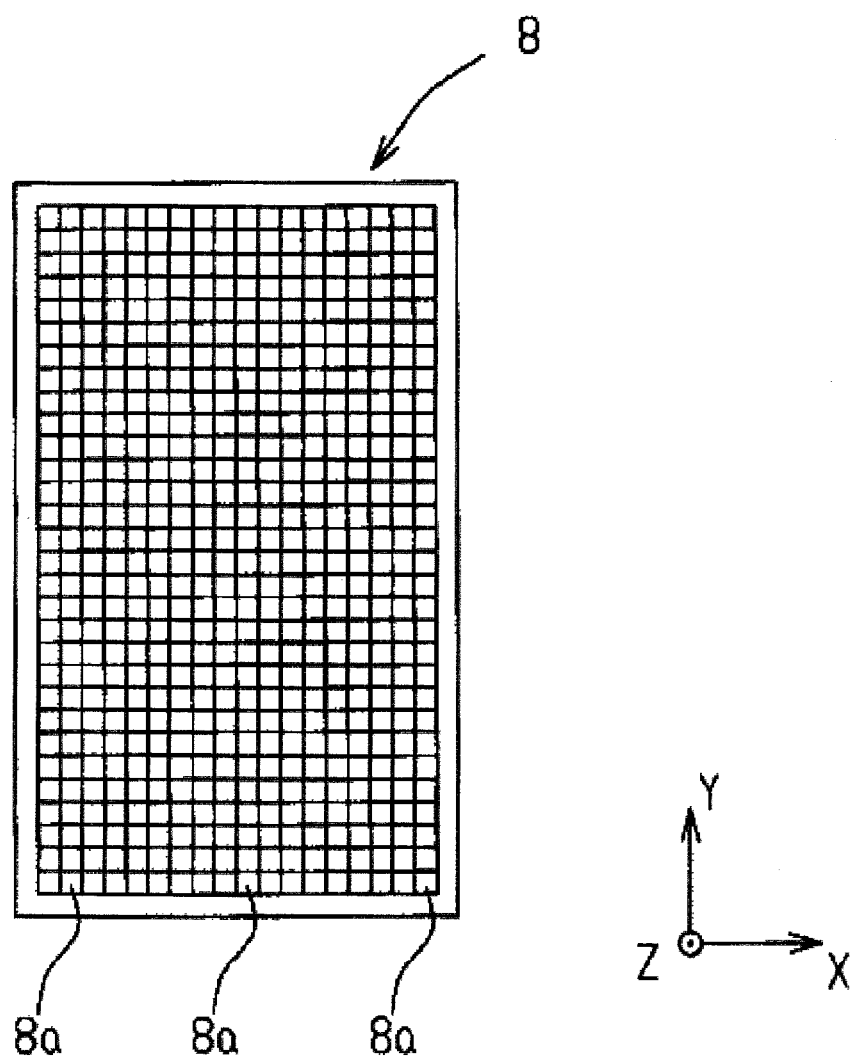
FIG. 3 is a diagram showing the structure of a DMD according to the embodiment of the present invention.

FIG. 3 is a diagram showing the structure of the DMD 8. The DMD 8 includes a large number of micromirrors (reflection members) 8a serving as a device divided into microscopic regions. Each micromirror 8a has a mirror surface that is inclinable (e.g., ±12 degrees) about the torsion axis. An electrode is arranged at the lower part of the mirror surface and driven to produce the two states of ON (+12 degrees) and OFF (−12 degrees). When the mirror is ON, the light from the light source LS is reflected in a predetermined direction (here, the direction of the projection optical system P1). When the mirror is OFF, the light is reflected in another predetermined direction (direction other than the projection optical system P1). Each mirror is individually controlled and driven to function as a variable shaped mask, which forms a light beam including any pattern transferred onto the plate P. In other words, in synchronization with the scanning of the plate P, the angles of some of the micromirrors 8a are varied so that the reflected light is guided to the projection optical system, and the angles of other micromirrors 8a are varied so that the reflected light travels in a direction that differs from the direction toward the projection optical system. This sequentially generates a transfer pattern that is projected onto a corresponding exposure region. The operation of the micromirror 8a of the DMD 8 is controlled by a DMD drive unit 130 under the control of the main controller 100.

Figure 4:
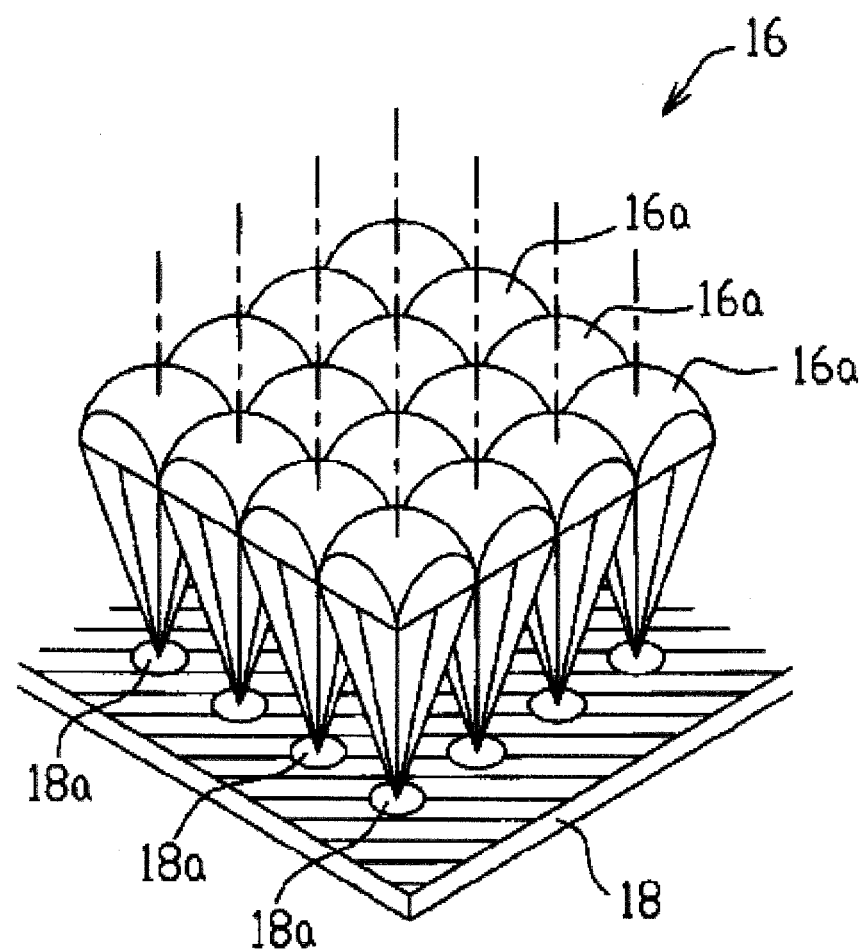
FIG. 4 is a diagram showing a micro lens array and part of a point image field stop according to the embodiment of the present invention.
Figure 4:
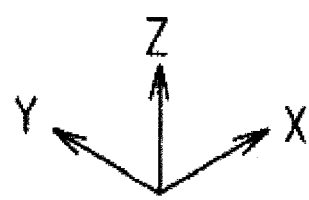

The light beam reflected by the DMD 8 (micromirror 8a of one part) enters a micro lens array 16 via a relay optical system (not shown). FIG. 4 is a diagram showing the structure of the micro lens array 16 and part of a point image field stop 18, which will be described later. The micro lens array 16, which includes a large number of element lenses 16a in correspondence with the micromirrors 8a of the DMD 8, is arranged at a position optically conjugated to or near the plate P. The micro lens array 16 is formed to be movable in a direction parallel to the XY plane and in the Z direction and inclinable with respect to the XY plane.

The light beam that has passed through each element lens 16a of the micro lens array 16 passes through the point image field stop 18. As shown in FIG. 4, the point image field stop 18 has a large number of apertures 18a formed in correspondence with the element lenses 16a of the micro lens array 16. Adverse effects of exposure caused by ghosts generated in the exposure optical unit L1 and image deletions that occur when the DMD 8 goes ON and OFF may be prevented by the passage of a light beam through each aperture 18a of the point image field stop 18.

Figure 5:
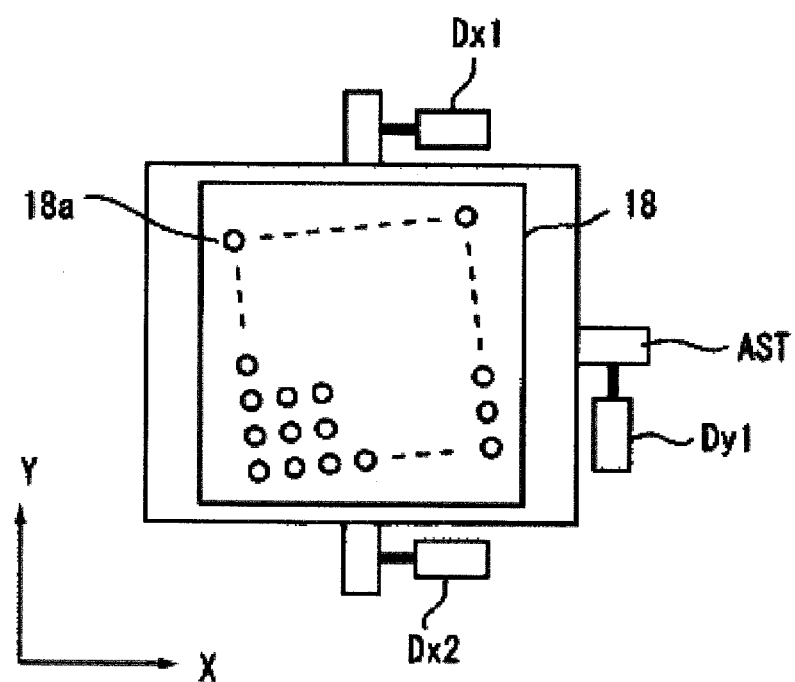
FIG. 5 is a diagram showing the structure of a drive system for the point image field stop according to the embodiment of the present invention.

The diameter of the apertures 18a in the point image field stop 18 is slightly smaller than the diameter of the light beam transmitted to the aperture 18a by the micro lens array 16. This difference allows for the adjustment of the positions of the apertures 18a. As shown in FIG. 5, the point image field stop 18 is arranged on a stage AST supported by drive systems (aperture drive systems) Dx1, Dx2, and Dy1 so that position adjustments can be made in the X direction, the Y direction, and the θ direction. The position and orientation of the point image field stop 18 may be detected with an interferometer (not shown) or an encoder arranged in the drive systems. The point image field stop 18 may include a large number of light transmitting portions arranged in correspondence with the element lenses 16a of the micro lens array 16 in lieu of the great number of apertures 18a.

As shown in FIG. 2, in this embodiment, the exposure optical unit L1 includes a mirror position detector 150 (detection device). The mirror position detector 150, which is a device for detecting the operation state of the DMD 8, includes a position detection light source 151, beam splitters 152 and 153, a light condensing lens system 154, a small aperture plate 155, and a light reception unit 156. The position detection light source 151 is a continuum light source (CW) for emitting red light and supplies the red light to the optical system of the exposure optical unit L1 via the beam splitter 152, arranged between the attenuator 2 and the collimator lens system 4.

The beam splitter 153, which is arranged between the DMD 8 and the micro lens array 16, transmits the ultraviolet light from the light source LS and reflects the red light from the position detection light source 151. The red light reflected by the beam splitter 153 enters the light reception unit 156 through the light condensing lens system 154 and the small aperture plate 155. The operation state of the micromirror 8a of the DMD 8 is monitored by monitoring the light quantity of the red light detected by the light reception unit 156. The monitoring result is sent to the main controller 100 for determination of whether the micromirror 8a is in the operation time or the stable time. A position sensor (sensor in which the resistance value changes by the position of the spot) or a tetrameric sensor may be arranged in lieu of the small aperture plate 155. A filter 157 for cutting the red light is arranged between the point image field stop 18 and a projection optical system PL1.

Figure 6:
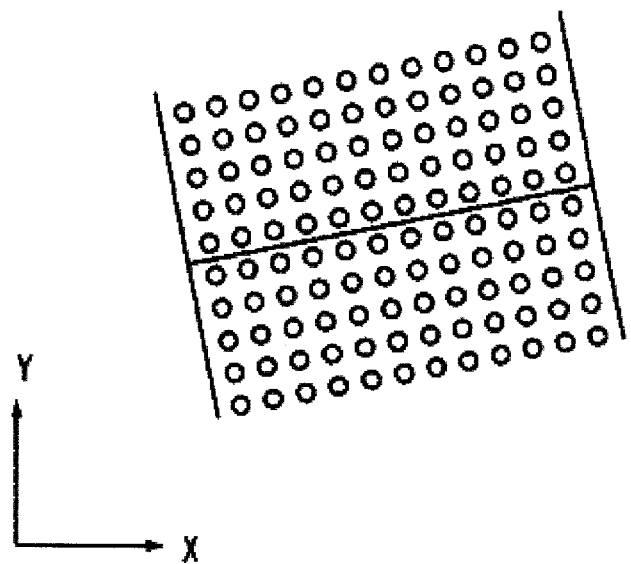
FIG. 6 is a diagram showing the layout of adjacent optical systems according to the embodiment of the present invention.
Figure 7:
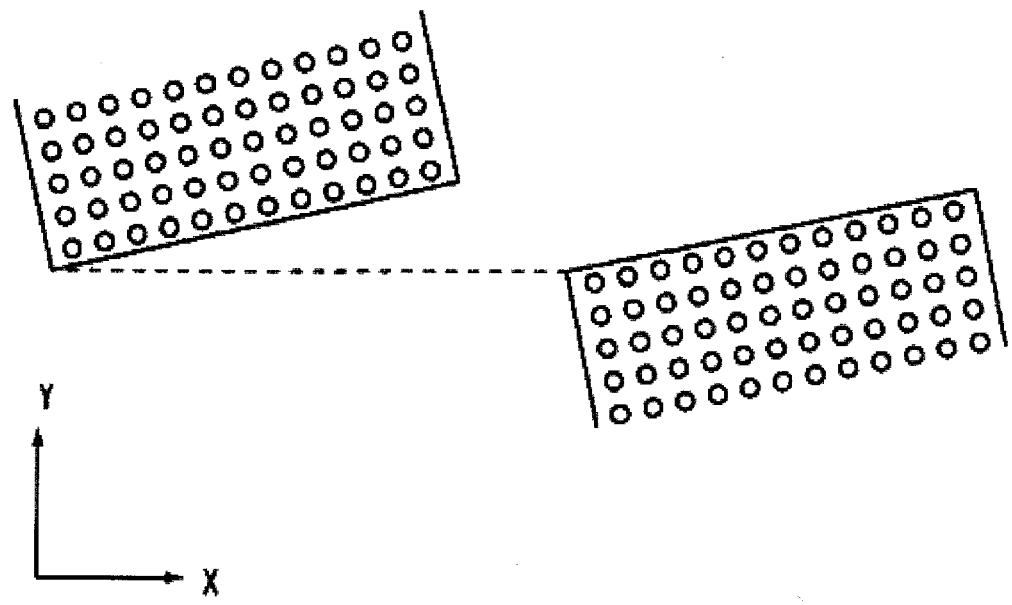
FIG. 7 is a diagram showing another layout of adjacent optical systems according to the embodiment of the present invention.

The other exposure optical units L2 to L13 also each include the DMD, the relay optical system, the micro lens array, the point image field stop, and the mirror position detector. The DMD, relay optical system, micro lens array, point image field stop, and mirror position detector each have the same structure as the DMD 8, the relay optical system 10, the micro lens array 16, the point image field stop 18, and the mirror position detector 150. As shown in FIG. 6, the optical system adjacent to each of the exposure optical units L1 to L13 may be arranged such that a multibeam (reflected light of each micromirror 8a in the DMD 8) is continuously aligned. Alternatively, as shown in FIG. 7, the multibeam may be spaced apart in the scanning direction (X direction).

Figure 8:
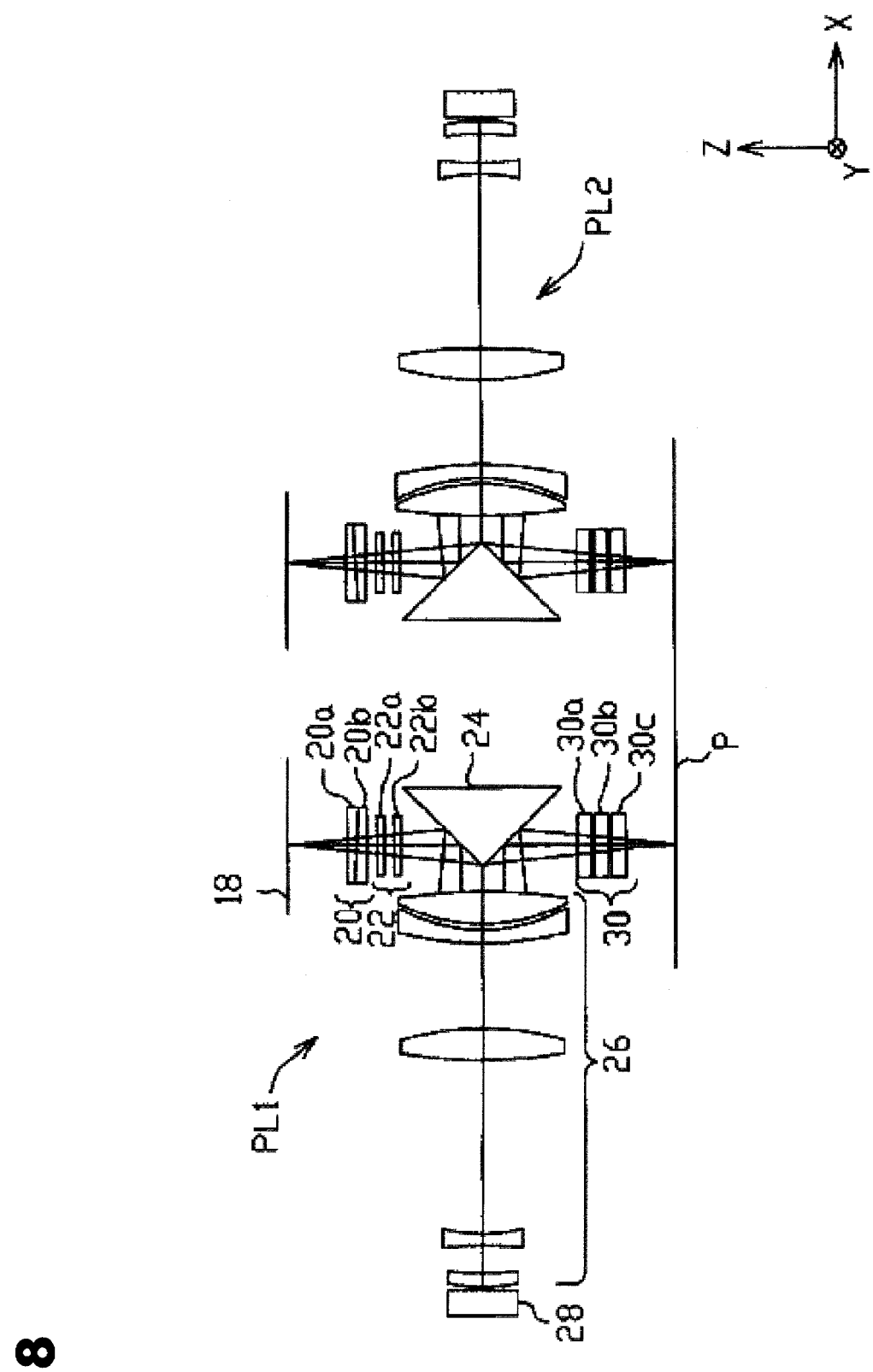
FIG. 8 is a diagram showing the structure of the projection optical system according to the embodiment of the present invention.

As shown in FIG. 2, the light beam that has passed through each aperture 18a in the point image field stop 18 enters the projection optical system PL1. FIG. 8 is a diagram showing the structure of the projection optical system PL1, which forms the exposure optical unit L1, and a projection optical system PL2, which forms the exposure optical unit L2. A light beam entering the projection optical system PL1 enters a focus adjustment mechanism 20, which forms the projection optical system PL1. The focus adjustment mechanism 20 includes a first optical member 20a and a second optical member 20b. The first optical member 20a and the second optical member 20b are wedge-shaped light beam transmissible glass plates and form by a pair of wedge-shaped optical members. The first optical member 20a and the second optical member 20b are relatively movable. An image plane position of the projection optical system PL1 moves in the Z direction by sliding (moving) the first optical member 20a in the X direction relative to the second optical member 20b.

The light beam that has passed through the focus adjustment mechanism 20 enters a shift adjustment mechanism 22. The shift adjustment mechanism 22 includes a parallel planar glass plate 22a, which is rotatable about the Y axis, and a parallel planar glass plate 22b, which is rotatable about the X axis. The image of a pattern on the plate P shifts in the X axis direction when the parallel planar glass plate 22a rotates about the Y axis. The image of the pattern on the plate P shifts in the Y axis direction when the parallel planar glass plate 22b rotates about the X axis.

The light beam that has passed through the shift adjustment mechanism 22 enters a rectangular prism 24 serving as a rotation adjustment mechanism. The rectangular prism 24 is rotatable about the Z axis. The image of a pattern on the plate P rotates about the Z axis when the rectangular prism 24 rotates about the Z axis. The light beam reflected by the rectangular prism 24 is reflected by the mirror 28 through a lens group 26. The light beam reflected by the mirror 28 travels again through the lens group 26 and the rectangular prism 24 and enters a magnification adjustment mechanism 30.

The magnification adjustment mechanism 30 includes, for example, three lenses 30a, 30b, and 30c each having a small power. The three lenses 30a to 30c are, for example, a concave lens 30a, a convex lens 30b, and a concave lens 30c. The convex lens 30b may be moved in the Z direction to adjust the magnification of the pattern image formed on the plate P. The light beam that has passed through the magnification adjustment mechanism 30 forms a predetermined pattern image in a predetermined exposure region on the plate P, which is for a flat panel display and has an outer dimension of 500 mm or greater, that is, one side or a diagonal line of the flat panel display plate P is greater than 500 mm. The projection optical systems forming the other exposure optical units L2 to L13 (hereinafter referred to as projection optical systems PL2 to PL13) have the same structure as the projection optical system PL1.

Figure 9:
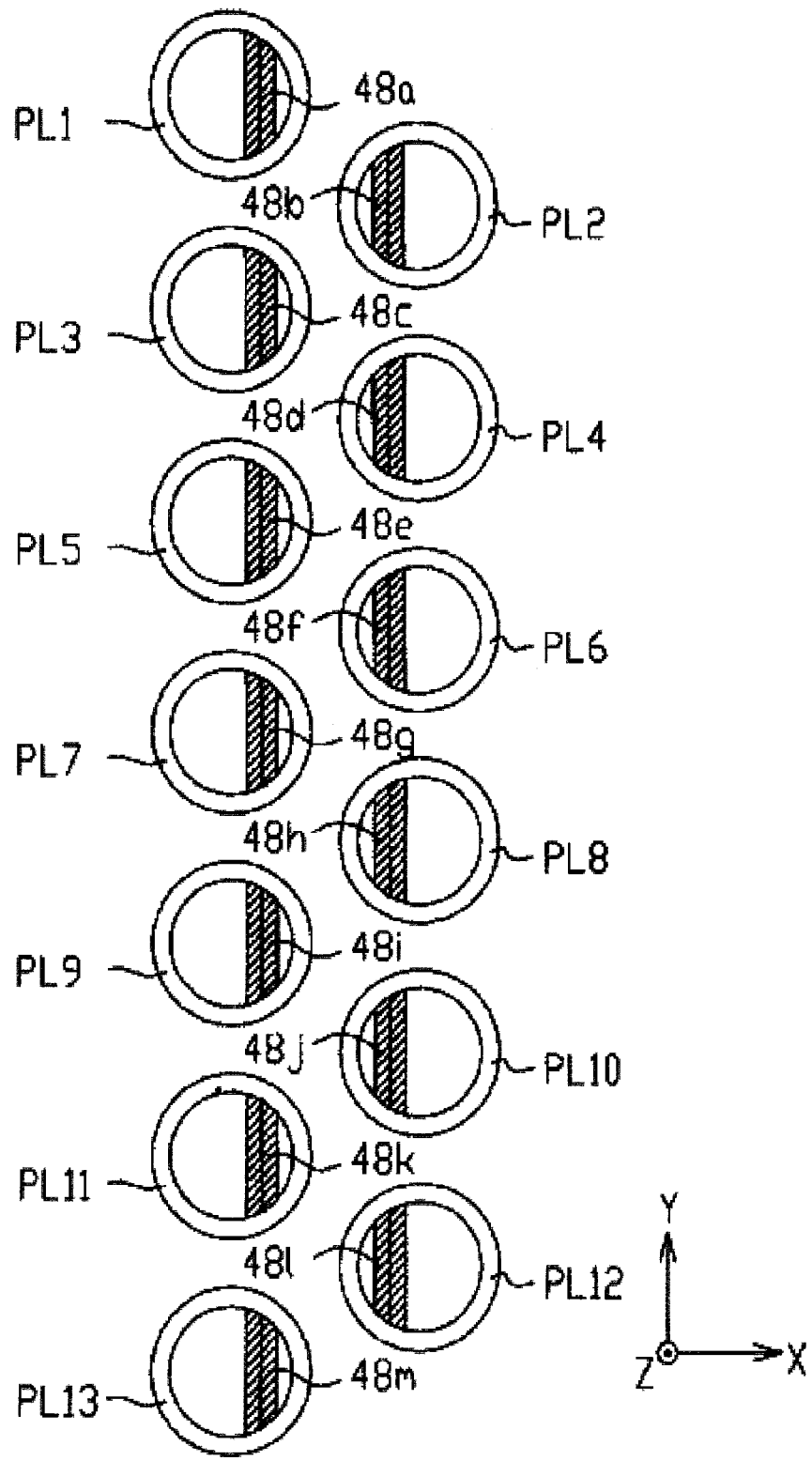
FIG. 9 is a plan view showing a projection region for each projection optical system on plates according to the embodiment of the present invention.

FIG. 9 is a plan view showing projection regions 48a to 48m of the projection optical systems PL1 to PL13 on the plate P. The projection regions 48a to 48m are set to have a predetermined shape (hexagon, rhombus, parallelogram, etc.) in correspondence to the view field region of the projection optical systems PL1 to PL13. In this embodiment, they have a trapezoidal shape. The projection regions 48a, 48c, 48e, 48g, 48i, 48k, and 48m are arranged facing in the X direction the projection regions 48b, 48d, 48f, 48h, 48j, and 48l. Further, the projection regions 48a to 48m are arranged in parallel so that the ends (boundary portions) of adjacent projection regions overlap each other in the Y direction.

As shown in FIG. 1, a plate stage PST for mounting the plate P is arranged on a base 34, which is supported by vibration isolation supports 32a and 32b and a vibration isolation support, which is not illustrated, (hereinafter referred to as vibration isolation support 32c). The vibration isolation supports 32a to 32c prevent external vibration from being transmitted to the exposure apparatus and is normally provided in quantities of three or more. The plate stage PST, which is movable in the scanning direction (X direction) by a linear motor 36, has the structure of a so-called air stage levitated from guides 37 to form an air gap. The plate stage PST also includes a micro-motion stage (not shown), which is movable by a fine amount in a non-scanning direction (Y direction).

An X-laser interferometer 38 measures the position of the plate stage PST in the X direction relative to the exposure optical units L1 to L13, which are fixed to the column 1, using moving mirrors 40a and 40b. Furthermore, a Y-laser interferometer (not shown) measures the position of the plate PST in the Y relative to the exposure optical units L1 to L13 with a moving mirror 42.

A plurality of alignment systems AL1 to AL6, which detect alignment marks arranged on the plate P, and auto focus systems AF1 to AF6, which detect the position of the plate P in the Z direction, are aligned in the Y direction (non-scanning direction) at rearward to the scanning direction of the exposure optical units L1 to L13 (−X direction side). A plurality of reference members 44, each including an AIS mark, are aligned in the Y direction and arranged at the −X direction end of the plate stage PST. An aerial image sensor (AIS) is arranged on the lower side of the reference members 44, and the aerial image sensor is embedded in the plate stage PST.

The aerial image sensor is used to obtain the relationship between the position of each DMD and the position at which the image of the transfer pattern (exposure pattern data) formed by the DMD is projected onto the plate P. In other words, to align the reference mark formed by the DMD with the AIS mark, the plate stage PST is moved, the image of the reference mark and the AIS mark are detected with the aerial image sensor, and, based on the detection result, the relationship between the position of the DMD and the position at which the image of the transfer pattern formed by the DMD is projected onto the plate P is obtained. The reference mark formed by the DMD in this case is stored in a memory (not shown) of the main controller 100, and the position of the plate stage PST is detected by the X-laser interferometer 38 and the Y-laser interferometer.

The aerial image sensor is also used to obtain the relationship between the positions of the alignment systems AL1 to AL6 and the position of the plate stage PST. In other words, the plate stage PST is moved to align the AIS mark with the center of the measurement region (specifically, index mark formed in the measurement region) of the alignment systems AL1 to AL6. Then, the position of the plate stage PST in this state is detected with the X-laser interferometer 38 and the Y-laser interferometer. The relationship between the positions of the alignment systems AL1 to AL6 and the position of the plate stage PST is obtained based on the detection result.

At least one illuminance meter (not shown) for measuring the illuminance of the light beam with each of the exposure optical units L1 to L13 is arranged in the vicinity of the plate stage PST. The illuminance meter, which is movable along the XY plane, moves to a position that allows for the measurement of the light beam emitted from each of the exposure optical units L1 to L13 and measures the illuminance of the light beam emitted from each exposure optical unit L1 to L13. The measurement result of the illuminance meter is output to the main controller 100.

Figure 10:
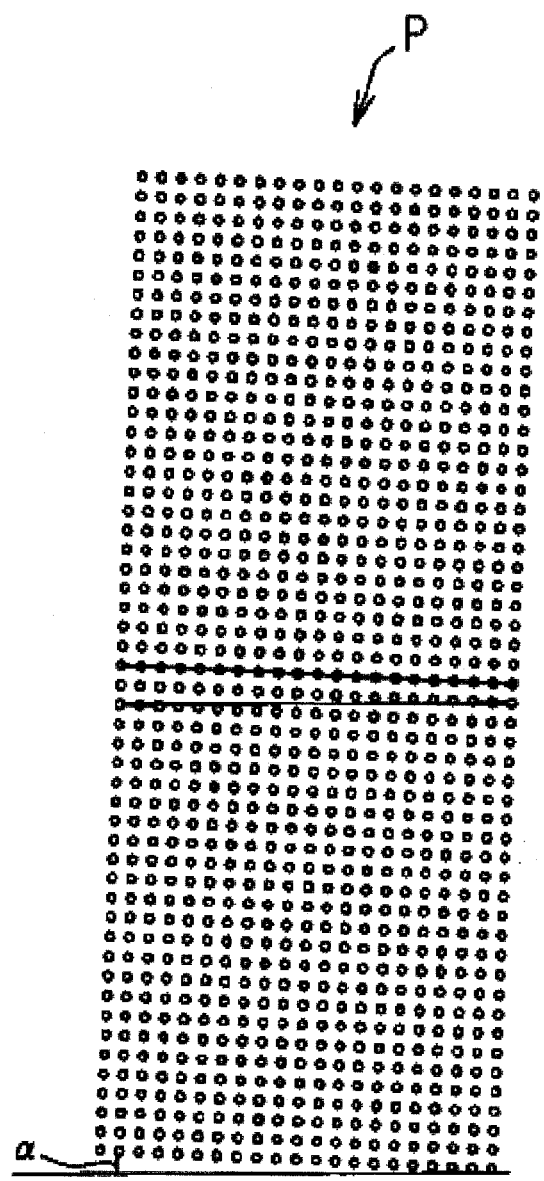
FIG. 10 is a diagram showing the position of the light beam that passes through each aperture of the point image field stop and reaches a plate according to the embodiment of the present invention.
Figure 10:
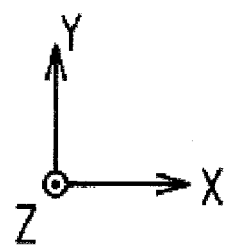

If the micromirrors 8a of the DMD 8, the element lenses 16a of the micro lens array 16, and the apertures 18a of the point image field stop 18 are laid out two-dimensionally on an XY plane in directions parallel to the X direction and the Y direction, the light beams that pass through the apertures 18a of the point image field stop 18 also reaches the plate P through the projection optical system PL laid out two-dimensionally in the X direction and the Y direction. When scanned and exposed in such state, linear patterns parallel to the X direction are formed but linear patterns parallel to the Y direction cannot be formed. In the present embodiment, these members are rotated and set by a predetermined angle α about the Z axis so that the linear patterns can also be exposed and formed parallel to the Y direction. Thus, the light beams that pass through the apertures 18a of the rotated point image field stop 18 reaches the plate P, as shown in FIG. 10. Thus, the positions of imaged points are shifted in fine amounts and these members are sequentially turned ON at predetermined positions to form linear patterns parallel to the X direction and the Y direction.

Figure 11:
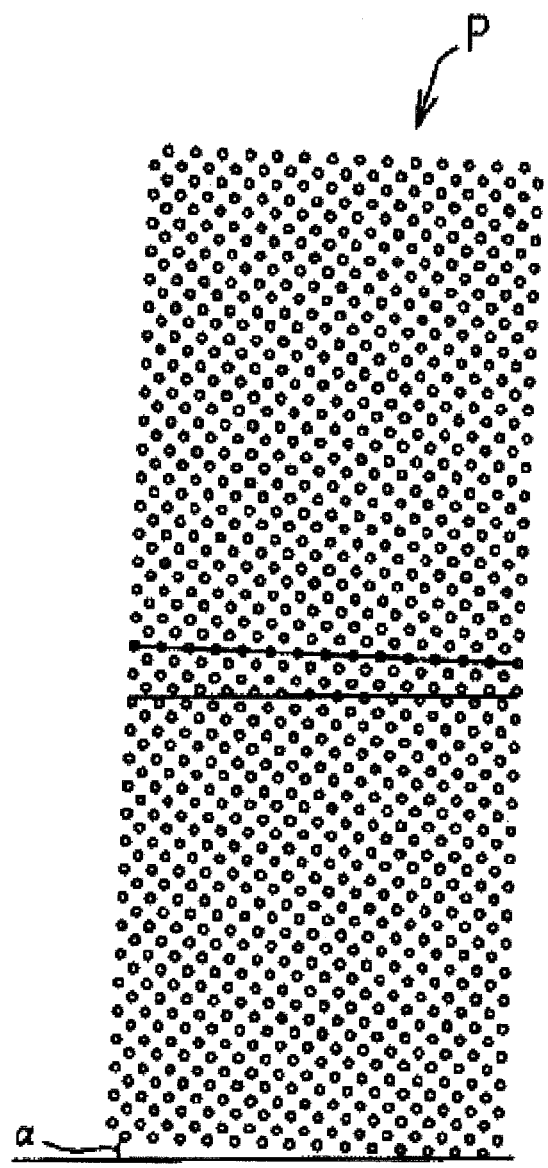
FIG. 11 is a diagram showing the position of the light beam that passes through each aperture of the point image field stop and reaches a plate according to the embodiment of the present invention.
Figure 11:
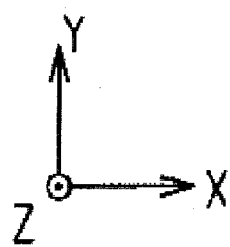

The light beams that pass through the apertures 18a of the point image field stop 18 may reach the plate P rotated by a predetermined angle about the Z axis by rotatably driving the rectangular prism 24 about the Z axis with a rectangular prism drive unit (not shown). Furthermore, in this embodiment, the apertures 18a of the point image field stop 18 are laid out two-dimensionally in the orthogonal biaxial direction on an XY plane. However, the apertures of a point image field stop may be laid out two-dimensionally in a direction inclined 45 degrees relative to the orthogonal bi-axis in an XY plane. In this case as well, the light beams that pass through the apertures of the point image field stop reach the plate P rotated by a predetermined angle α about the Z axis, as shown in FIG. 11.

Although not shown in the drawings, the main controller 100 shown in FIG. 2 includes a memory for storing transfer patterns formed in the DMD 8, reference marks used for alignment and aerial image measurement, and other exposure data. The controller 100 entirely manages and controls units including the laser control unit 110, the light quantity control unit 120, the DMD drive unit 130, and a stage drive unit 140.

A process for synchronizing the operation timing of the DMD 8, which changes the operation state of the DMD 8, and the pulse emission timing of pulse light, which is emitted from the light source LS, with the main controller 100 will now be discussed. In this embodiment, the operation timing of a mirror and the pulse emission timing are synchronized by substantially matching the cycle of a pulse light emitted from the light source LS and the cycle of the operation of the micromirror 8a of the DMD 8. The synchronization is performed in such manner for the reasons described below.

Figure 12:
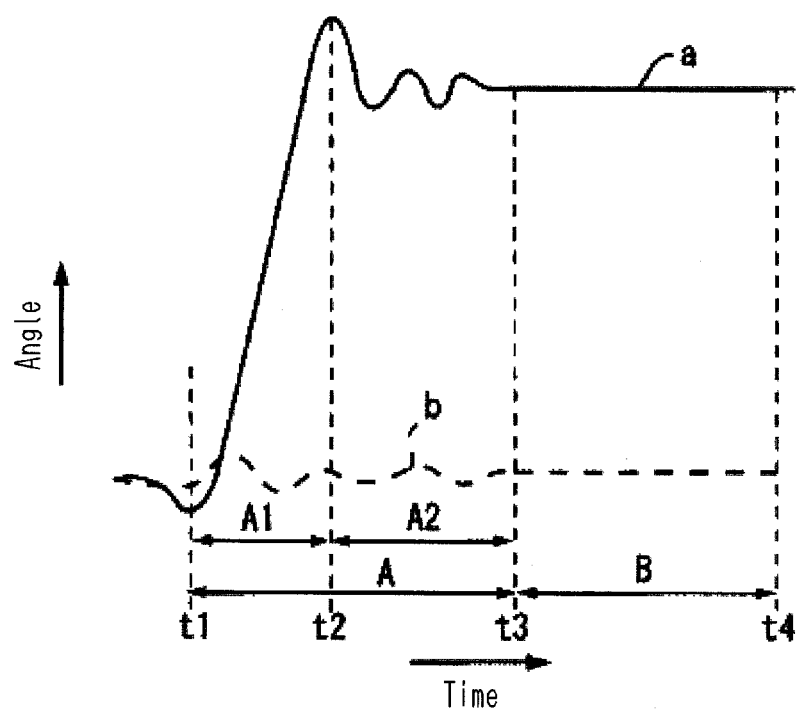
FIG. 12 is a diagram showing the behavior of a micromirror in a DMD according to the embodiment of the present invention.

FIG. 12 shows the operation of a micromirror 8a in the DMD 8. In the drawing, the vertical axis indicates the inclination angle of the micromirror 8a and the horizontal axis indicates time, reference character a denotes an operation performed during a mirror inversion period, and reference character b denotes an operation performed during a mirror hold period. As shown by the curve denoted by the reference character a in the drawing, in a mirror inversion period, the main controller 100 sends a mirror drive start signal to the DMD drive unit 130 at time t1 so that the DMD drive unit 130 drives the electrode and starts the inversion operation of the micromirror 8a. After reaching the maximum angle at time t2, vibration converges. A stable state, that is, a still state, is reached at time t3. This stable state is held until time t4, which is when the next drive starts. The data for the next operation of the DMD 8 (micromirror 8a) is updated during the stable time from time t3 to t4, and the next operation of the DMD 8 starts after time t4.

Here, time t1 to t3 during which the behavior of the mirror is unstable is referred to as the operation time A, and time t3 to t4 during which the micromirror 8a is still is referred to as the stable time B. Time t1 to t2 (time A1 during which the mirror changes its inclination) from when the driving of the micromirror 8a starts to when reaching the maximum angle of the operation time A is about five microseconds, and time t2 to t3 (settling time A2) from when the micromirror 8a reaches the maximum angle to when vibration converges is about ten microseconds. Since the inclination of the micromirror 8a is indefinite during the operation time A, the position of the reflected light is not stable. Thus, the reflected light of which beam position is stable can be used only during the stable time B.

Figure 13:
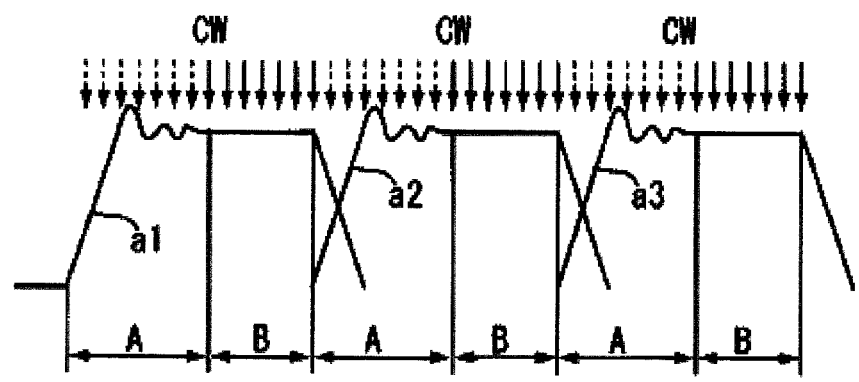
FIG. 13 is a diagram showing the drawbacks resulting from the use of a continuum light source in the prior art.

In other words, the reflected light does not contribute to exposure during the operation time A and thereby lowers the illuminance in the scan type exposure apparatus. FIG. 13 shows the emission of continuous light. The broken line arrows and solid line arrows shown at the upper part of the drawing schematically show the emission of continuous light (CW). Reference characters a1 to a3 respectively show the operations of the micromirror 8a (for three cycles). As apparent from the drawing, in the mirror operations a1 to a3 of each cycle, among the emitted lights, only the lights emitted during the stable times B (solid line arrows) contribute to exposure, and the lights emitted during the operation time A (broken line arrows) do not contribute to exposure and become completely wasted.

Accordingly, in order to ensure the necessary exposure amount during the stable time B, a light source (laser) having a large power must be used. Otherwise, the scanning speed needs must be lowered to extend the stable time B. When using a light source having a large power, such a light source is generally costly and thereby increases the cost of the apparatus. Furthermore, emission is continued even during the operation time A in which the light does not contribute to exposure. The light emission increases the temperature of each unit, deteriorates the unit, and shortens the lifespan. Additionally, the throughput (production amount per time) decreases when the scanning speed is lowered.

Figure 14:
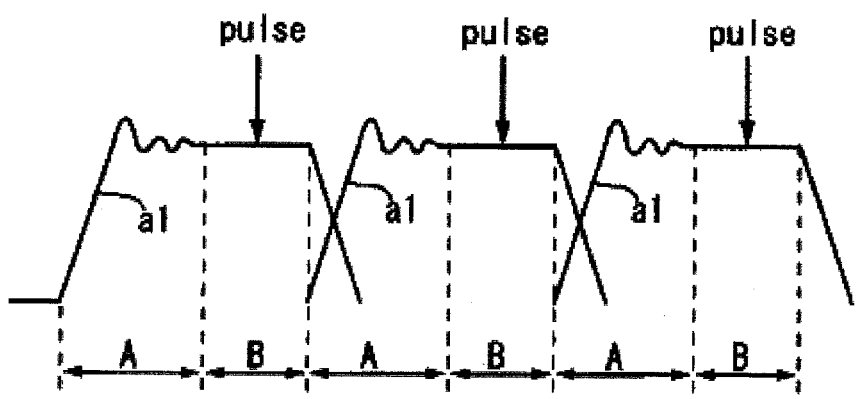
FIG. 14 is a diagram showing pulse emission timings and mirror operation timings according to the embodiment of the present invention.

Thus, in this embodiment, the Q-switch laser is used as the light source LS, and pulses are emitted during the stable time B. Referring to FIG. 14, the Q-switch is turned OFF during the operation time A of the micromirror 8a to accumulate energy in the laser, and the Q-switch is turned ON during the stable time B of the micromirror 8a to discharge the all of the accumulated energy at once and emit a pulse having a large power.

Accordingly, light is not emitted during the operation time A in which no contribution is made to exposure, and light is emitted only during the stable time B in which contribution is made to exposure. Furthermore, due to the use of the Q-switch, energy of the Q-switch is accumulated at least during the operation time A. Thus, the energy is not wasted, and the utilization efficiency of the energy is enhanced. This reduces costs and increases the throughput. The frequency of the pulse light emitted from the light source LS and the frequency of the operation of the micromirror 8a are determined based on the relationship with the movement speed (scanning speed) of the plate P. In this embodiment, both frequencies are 10 kHz.

A control for synchronizing the emission timing of the pulses from the light source LS with the operation timing of the micromirror 8a of the DMD 8 may be realized by having the main controller 100 control the Q-switch SW through the laser control unit 110 such that the emission timing of the pulses from the light source LS is synchronized with the operation timing of the micromirror 8*a* of the DMD 8. Alternatively, the synchronization control may be realized by having the main controller 100 control the DMD 8 through the DMD drive unit 130 such that the operation timing of the micromirror 8*a* of the DMD 8 is synchronized with the emission timing of the pulse from the light source LS. The synchronization control may also be realized by executing both of these controls.

Referring to FIG. 2, in the present embodiment, the mirror position detector 150 is used, and the light emitted from the position detection light source 151 and reflected by the DMD 8 is detected by the mirror position detector 150 so that the operation state (whether the micromirror 8*a* is in the operation time A or the stable time B) of the micromirror 8*a* of the DMD 8 may be monitored. Thus, a stable state determination device (not shown) serving as a function module of the main controller 100 determines whether or not the micromirror 8*a* of the DMD 8 is in the stable state based on the detection result of the mirror position detector 150 and dynamically controls the operation of the Q-switch SW through the laser control unit 110 so that pulses are emitted from the light source LS during the stable time B. This ensures that pulses are emitted during the stable time B in synchronization with the actual behavior of the mirror.

The stable state determination device may perform the control described below in lieu of the above control. Pulses may be emitted at the time point when a fixed time elapses from the mirror drive start signal since the behavior of the micromirror 8*a* of the DMD 8 does not change much between operations. For example, the mirror may be rotated to the maximum angle in about five microseconds from the mirror drive start signal and then stabilized in about ten microseconds. In such a case, pulses may be emitted when 17 to 20 microseconds elapse from the output of the mirror drive start signal until when the next mirror drive start signal is output. The elapsed time from the drive start signal until when reaching the stable state is measured using the mirror position detector 150, if one is available, or measured off-line. Alternatively, numerical values in the specification provided by the manufacturer of the DMD 8 may be used. Further, when a position monitor signal line is provided for a plurality of movable mirrors forming the variable shaped mask, the stable state determination device may receive a signal related to the mirror state through the signal line and determine the stable state. Although mirror vibration is mainly produced when a mirror is driven, vibration may also be produced by external mechanical vibration. The present embodiment is applicable even in such a case.

Figure 15:
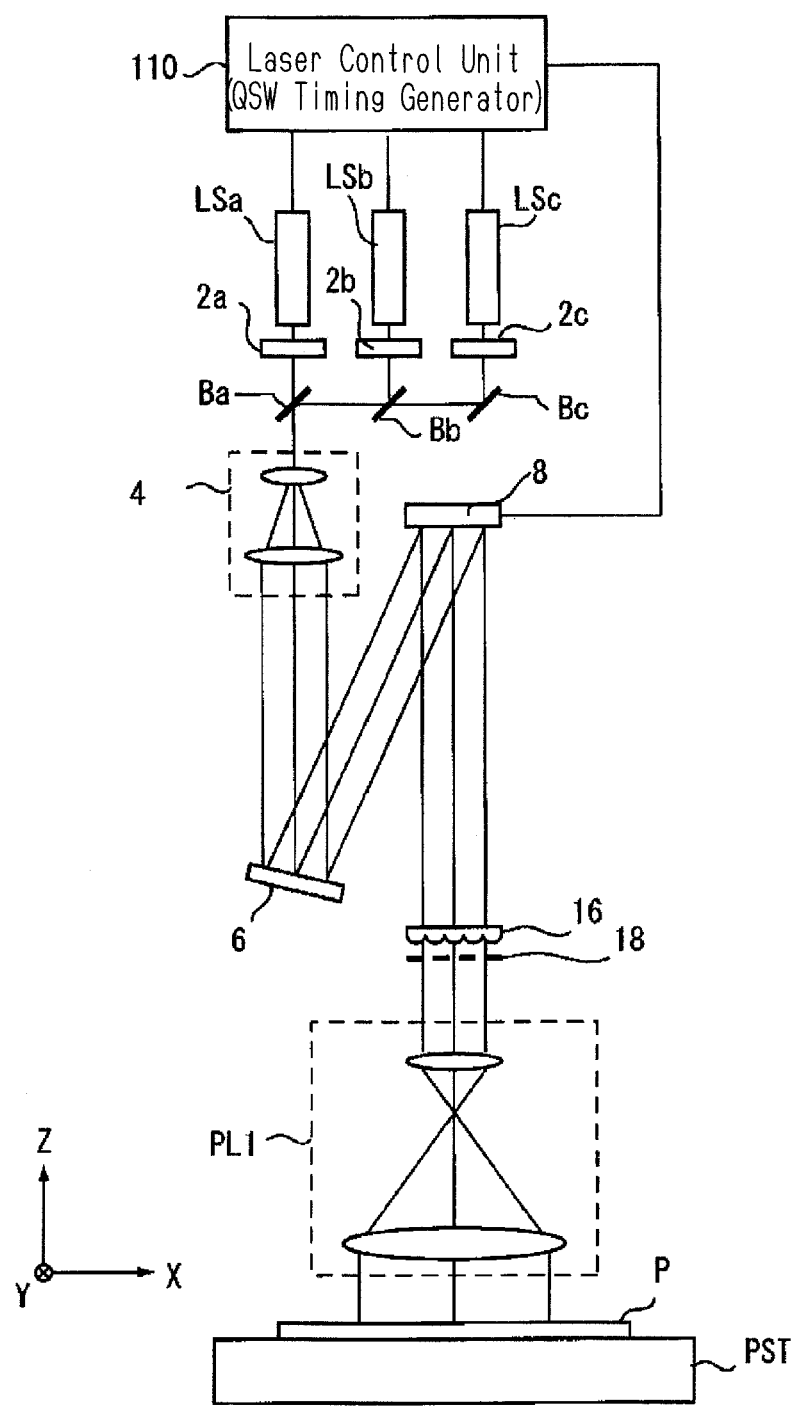
FIG. 15 is a diagram showing the structure of an exposure optical unit according to another embodiment of the present invention.

Another embodiment of a scanning exposure apparatus according to the present invention will now be discussed with reference to FIG. 15. A single Q-switch laser is used as the light source LS in the above-described embodiment. However, a plurality of, three in this case, Q-switch lasers (light source units) are arranged in this embodiment. Components that are substantially the same as those of FIG. 2 are denoted with the same reference characters numbers and will not be described below. As shown in the drawing, three Q-switch lasers, a first laser Lza, a second laser Lzb, and a third laser Lzc, are used. Each of the lasers Lza, Lzb, and Lzc are similar to the Q-switch laser that is used as the above-described light source LS and emit an ultraviolet pulse light with a wavelength conversion device. The pulse light emitted from each of the lasers Lza, Lab, and Lzc is guided to the same optical path via the corresponding attenuators (variable beam attenuators) 2*a*, 2*b*, and 2*c* and optical path coupling beam splitters Ba, Bb, and Bc, and sent to the collimator lens system 4.

The Q-switch of each of the lasers Lza, Lab, Lzc is controlled by the QSW timing generator of the laser control unit 110. When the QSW timing generator functions to have the lasers Lza, Lab, and Lzc simultaneously emit pulses, a large power combining the three laser lights may be obtained, and variations in the power of the lasers Lza, Lab, and Lzc may be averaged. This improves the illumination uniformity. As described above, the emission timing for a large power pulse obtained by synchronizing the emission timing of the pulses of the three lasers Lza, Lab, and Lzc is when the operation of the micromirror 8*a* of the DMD 8 is in the stable time B in the same manner as in the above-described embodiment.

The Q-switch laser may adjust the frequency of the output pulse light to a certain extent within a small range by controlling the operation of the Q-switch. However, an efficient frequency exists in this laser.

Nevertheless, in this embodiment, for example, when the pulse light of the lasers Lza, Lab, and Lzc have a frequency of about 10 kHz and is thereby efficient, and the frequency of the operation of the micromirror 8*a* of the DMD 8 is 30 kHz and thereby enables high-speed operation, the frequency of the pulse light may be 30 kHz by emitting pulses from the three lasers Lza, Lab, Lzc in a sequentially shifted manner. Thus, the emission timings of the pulses may be synchronized with the operation timing of the DMD 8. When shifting the emission timing of pulses to generate a pulse light having a high frequency in its entirety, it is preferable that the output of the pulse light from each of the lasers Lza, Lab, Lzc be synchronized with one another by adjusting the attenuators 2*a*, 2*b*, and 2*c*.

The quantity of the lasers is three in this case, but may be two or four or more, and the lasers may be combined in any manner. For instance, six lasers may be used, with one group being formed by two lasers. The pulses may be simultaneously emitted in each group and the emission timing of the pulse from each group may be shifted so as to increase the laser output and increase the frequency of the pulse light in its entirety. To obtain illumination uniformity, a single laser may be branched into a plurality of parts and then recombined. Alternatively, a filter in which the transmissivity is optically corrected two-dimensionally may be used in lieu of the attenuator.

In the above description, a pulse emission is performed once in synchronization with the operation state of the variable shaped mask (DMD) when the movable mirror is in the stable state. However, the pulse emission may be performed a plural number of times, that is, two or more times during a fixed period in a stable state.

The control of each movable mirror of the variable shaped mask (DMD) is basically a binary control of ON/OFF. However, a pattern image of an intermediate gray level (gray scale) may be formed by performing an ON/OFF operation at a sufficiently high speed in relation with the scanning speed and varying the ON/OFF time ratio (ratio of light transmitted through or reflected by the variable shaped mask within a predetermined time). In this case as well, light (pulse) is emitted in each stable state during the high-speed operation to obtain the desired gray level. In relation to the ON/OFF time ratio, the intermediate gray level can be further adjusted by changing the width, energy density, and quantity of the pulses emitted in each stable state.

As a method for emitting light from a light source in synchronization with the operation state of the variable shaped mask, the variable shaped mask may be operated in advance before a predetermined time when light is emitted, and the light may be emitted after checking the operation state. In this embodiment, the DMD 8 reflects light in the direction of the projection optical system PL1 when turned ON. Instead, the DMD 8 may reflect light in the direction of the projection optical system PL1 when turned OFF.

In the scanning exposure apparatus of each of the embodiments described above, a micro device (liquid crystal display device, semiconductor element, imaging element, thin-film magnetic head, etc.) may be manufactured by performing an exposure step of exposure-transferring a transfer pattern formed by the variable shaped mask on the photosensitive substrate (plate) using a projection optical system. Then, a development step may be performed to develop the exposure-transferred pattern. One example of a method for obtaining a semiconductor device serving as a micro device by forming a predetermined circuit pattern on a plate or the like serving as a photosensitive substrate using the scanning exposure apparatus of each of the above-described embodiment will now be discussed with reference to the flowchart of FIG. 16.

Figure 16:
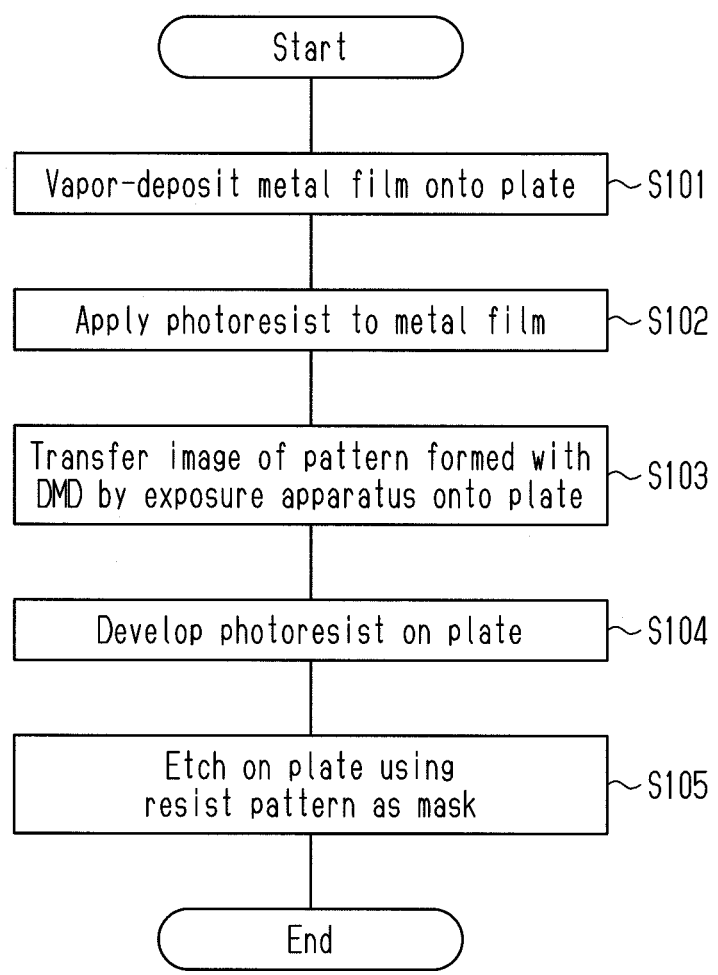
FIG. 16 is a flowchart showing a manufacturing method of a semiconductor device serving as a micro device according to the embodiment of the present invention.

First, in step S101 of FIG. 16, a metal film is vapor-deposited on a plate of a single lot. In step S102, photoresist is applied to the metal film on the plate of the single lot. Thereafter, in step S103, the image of a pattern formed by the variable shaped mask is sequentially exposure-transferred onto each shot region of the plate in the single lot by the projection optical system using the scanning exposure apparatus according to each of the above-described embodiments. Subsequently, in step S104, the photoresist on the plate of the single lot is developed. Then, in step S105, etching is performed using a resist pattern as a mask on the plate in the single lot. This forms a circuit pattern corresponding to the pattern formed by the variable shaped mask on each plate.

Subsequently, a device such as a semiconductor element may be manufactured by forming a circuit pattern on an upper layer. In the semiconductor device manufacturing method described above, the energy utilization efficiency of the light source is high. Thus, the semiconductor device may be manufactured at a low cost and satisfactory productivity. In steps S101 to S105, the steps of vapor-depositing metal on the plate, applying resist to the metal film, exposing, developing, and etching are performed. However, it is apparent that prior to these steps, after forming a silicon oxide film on the plate, the steps of applying a resist on the silicon oxide film, exposing, developing, and etching may be performed.

Figure 17:
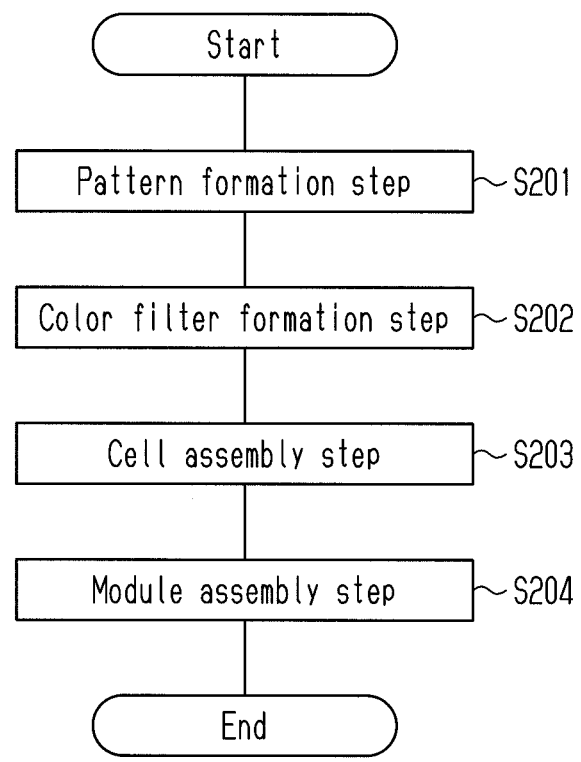
FIG. 17 is a flowchart showing a manufacturing method for a liquid crystal display device serving as the micro device according to the embodiment of the present invention.

In the scanning exposure apparatus according to each of the above-described embodiments, a liquid crystal display device serving as a micro device may be obtained by forming a predetermined pattern (circuit pattern, electrode pattern, etc.) on the plate (glass substrate). One example of the method in this case will be described below with reference to the flowchart of FIG. 17. First, in a pattern formation step S201 of FIG. 17, a so-called optical lithography step of transferring and exposing a pattern formed by the variable shaped mask on a photosensitive substrate (glass substrate applied with resist, etc.) using the scanning exposure apparatus according to each of the above-described embodiments is executed. A predetermined pattern including many electrodes and the like is formed on the photosensitive substrate in the optical lithography step. Thereafter, the exposed substrate undergoes steps such as a developing step, an etching step, and a resist removal step to form a predetermined pattern on the substrate. Then, a color filter formation step S202 is performed.

The color filter formation step S202 is for forming a color filter including many sets of three dots corresponding to R (Red), G (Green), and B (Blue) laid out in a matrix or a color filter including sets of three filters stripes for R, G, and B laid out in the horizontal scanning line direction. After the color filter formation step S202, a cell assembly step S203 is performed. In the cell assembly step S203, for example, liquid crystal is injected into the space between the substrate having the predetermined pattern obtained in the pattern formation step S201 and the color filter obtained in the color filter formation step S202 to manufacture a liquid crystal panel (liquid crystal cell).

Thereafter, in a module assembly step S204, each component such as electric circuits and backlights for performing display operations with the assembled liquid crystal panel (liquid crystal cell) is attached to complete the liquid crystal display device. In the manufacturing method of the liquid crystal display device described above, the energy utilization efficiency of the light source is high. Thus, the liquid crystal display device is manufactured with a low cost and satisfactory productivity.

The above-described embodiments have been discussed to facilitate the understanding of the present invention and do not limit the present invention. Accordingly, the elements disclosed in the above-described embodiments include all design changes and equivalents that are within the technical scope of the present invention.

The present disclosure relates to the subject matter in Japanese Patent Publication No. 2007-015391 filed on Jan. 25, 2007, the entire contents of which are hereby explicitly incorporated by reference.

What is claimed is:

1. An exposure method for exposing a substrate with light emitted from a light source and traveling through a variable shaped mask for forming an arbitrary pattern, the exposure method comprising:
    performing emission of the light emitted from the light source in synchronization with an operation state of the variable shaped mask;
    detecting the operation state of the variable shaped mask, and determining whether or not the variable shaped mask is in the stable state,
    wherein the emission of the light from the light source is performed when the operation state of the variable shaped mask is in a stable state after data is updated.

2. A micro device manufacturing method comprising:
    exposing a pattern onto a substrate with the exposure method according to claim 1; and
    developing the substrate onto which the pattern has been exposed.

3. An exposure apparatus that exposes a substrate with light emitted from a light source via a variable shaped mask, which forms an arbitrary pattern by selectively changing an operation state of the variable shaped mask, the exposure apparatus comprising:
    a controller which controls the emission of the light emitted from the light source in synchronization with the operation state of the variable shaped mask; and
    a stable state determination device, which determines whether or not the variable shaped mask is in a stable state after operation,
    wherein the controller controls the light source based on the determination of the stable state determination device, and
    the stable state determination device includes a detection device which detects the operation state of the variable shaped mask.

4. An exposure method comprising:
    illuminating a variable shaped mask, which includes a plurality of movable mirrors, with pulse light emitted from a light source so as to expose a substrate with the pulse light that travels via the variable shaped mask such that an arbitrary pattern is formed on the substrate;

driving the plurality of movable mirrors of the variable shaped mask;

detecting respective operation states of the plurality of movable mirrors;

determining whether or not the movable mirrors are stationary; and controlling at least one of the light source and the plurality of movable mirrors such that the pulse light does not illuminate the variable shaped mask when the plurality of movable mirrors are moving and such that the pulse light illuminates the variable shaped mask when the plurality of movable mirrors are stationary.

5. The exposure method according to claim 4, wherein the light source is a Q-switched laser that emits said pulse light.

6. The exposure method according to claim 4, further comprising:

measuring an elapsed time to when the plurality of movable mirrors become stationary by using a drive signal for starting the movement of the plurality of movable mirrors; and determining that the movable mirrors are stationary based on subsequent drive signals after the elapsed time has occurred.

7. The exposure method according to claim 6, wherein the elapsed time is a time from when the drive signal is sent for starting the movement of the plurality of movable mirrors to when the plurality of movable mirrors become stationary.

8. The exposure method according to claim 4, wherein the controlling includes:

setting a plurality of gray levels of the arbitrary pattern; and emitting the pulse light while the movable mirrors are stationary to form the gray levels of the arbitrary pattern on the substrate.

9. The exposure method according to claim 4, wherein the plurality of movable mirrors are aligned in an array, and the emission of the pulse light from the light source is synchronized with operation states of the plurality of movable mirrors.

10. A micro device manufacturing method comprising:

exposing a pattern onto a substrate using the exposure method according to claim 4; and developing the exposed pattern on the substrate.

11. An exposure apparatus that illuminates a variable shaped mask, which includes a plurality of movable mirrors, with pulse light emitted from a light source so as to expose a substrate with the pulse light that travels via the variable shaped mask such that an arbitrary pattern is formed on the substrate, the exposure apparatus comprising:

a drive unit that drives the plurality of movable mirrors of the variable shaped mask;

a stable state determination device configured to determine whether or not the movable mirrors are stationary; and a controller coupled to the drive unit, wherein the controller is configured to control at least one of the light source and the plurality of movable mirrors such that the pulse light does not illuminate the variable shaped mask when the plurality of movable mirrors are moving and such that the pulse light illuminates the variable shaped mask when the plurality of movable mirrors are stationary, wherein the controller is configured to control the light source based on the determination by the stable state determination device, and wherein the stable state determination device includes a detection device that detects operation states of the plurality of movable mirrors.

12. The exposure apparatus according to claim 11, wherein the light source is a Q-switched laser.

13. The exposure apparatus according to claim 11, wherein the light source includes a plurality of light source units, and the controller is configured to control the light source units to provide sequential pulse light emission synchronized with operation states of the plurality of movable mirrors.

14. The exposure apparatus according to claim 13, wherein the controller is configured to control the light source units to provide multiple pulse light emissions during a stationary period of the movable mirrors between consecutive drive periods.

15. The exposure apparatus according to claim 11, wherein the stable state determination device is configured to:

measure an elapsed time to when the plurality of movable mirrors becomes stationary by using a drive signal for starting the movement of the plurality of movable mirrors; and determine that the movable mirrors are stationary based on subsequent drive signals after the elapsed time has occurred.

16. The exposure apparatus according to claim 15, wherein the elapsed time is a time from when the drive signal is sent for starting the movement of the plurality of movable mirrors to when the plurality of movable mirrors become stationary.

17. The exposure apparatus according to claim 11, wherein the controller is configured to:

set a plurality of gray levels of the arbitrary pattern; and control the light source to emit the pulse light while the movable mirrors are stationary to form the gray levels of the arbitrary pattern on the substrate.

18. The exposure apparatus according to claim 11, wherein the plurality of movable mirrors are aligned in an array.

* * * * *